(12) United States Patent
Buynoski et al.

(10) Patent No.: US 6,872,644 B1
(45) Date of Patent: Mar. 29, 2005

(54) SEMICONDUCTOR DEVICE WITH NON-COMPOUNDED CONTACTS, AND METHOD OF MAKING

(75) Inventors: Matthew S. Buynoski, Palo Alto, CA (US); Witold P. Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 27 days.

(21) Appl. No.: 10/126,211

(22) Filed: Apr. 19, 2002

Related U.S. Application Data

(60) Provisional application No. 60/302,941, filed on Jul. 3, 2001.

(51) Int. Cl.[7] ........................ H01L 21/265; H01L 21/22; H01L 21/38
(52) U.S. Cl. ........................ 438/558; 438/522; 438/537; 438/573; 438/580
(58) Field of Search .................... 438/162, 533, 438/537, 558, 522, 685–688, 570, 578, 648, 650, 301, 543; 257/382, 383, 377, 384

(56) References Cited

U.S. PATENT DOCUMENTS

| | | | | |
|---|---|---|---|---|
| 4,040,073 A | * | 8/1977 | Luo | 257/66 |
| 4,348,802 A | * | 9/1982 | Shirato | 438/297 |
| 4,432,008 A | * | 2/1984 | Maltiel | 357/51 |
| 5,001,082 A | * | 3/1991 | Goodwin-Johansson | 438/297 |
| 5,516,725 A | * | 5/1996 | Chang et al. | 438/572 |
| 5,543,342 A | * | 8/1996 | Mukai et al. | 438/197 |
| 6,037,233 A | * | 3/2000 | Liu et al. | 438/304 |
| 6,329,274 B1 | * | 12/2001 | Inoue et al. | 438/561 |
| 6,337,250 B2 | * | 1/2002 | Furuhata | 438/301 |
| 6,525,381 B1 | * | 2/2003 | Long et al. | 257/384 |
| 6,545,326 B2 | * | 4/2003 | Fukada et al. | 257/388 |

* cited by examiner

*Primary Examiner*—Jerome Jackson
*Assistant Examiner*—Jesse A. Fenty
(74) *Attorney, Agent, or Firm*—Renner, Otto, Boisselle & Sklar, LLP

(57) ABSTRACT

A semiconductor device includes source and drain contact regions which include a non-compounded combination of a semiconductor material and at least one metal. The metal may include an elemental metal, such as gold or aluminum, or may include an intermetallic. The contact regions may be formed by depositing a limited amount of the at least one metal on a source and a drain of the device, and annealing the device to induce diffusion of the at least one metal into the source and drain. The annealing time and temperature may be selected to limit diffusion of the at least one metal.

9 Claims, 3 Drawing Sheets

SEMICONDUCTOR DEVICE WITH NON-COMPOUNDED CONTACTS, AND METHOD OF MAKING

This application claims priority from U.S. Provisional Application Ser. No. 60/302,941, filed Jul. 3, 2001, which is herein incorporated by reference in its entirety.

BACKGROUND OF THE INVENTION

1. Field of Invention

The present invention relates to semiconductor devices and their manufacture.

2. Description of the Related Art

Contacts with source and drain regions of semiconductor devices such as field effect transistors (FETs) as usually made through semiconductor-metal compound regions, such as silicide regions. The semiconductor-metal compound regions typically have well-defined boundaries with the remainder of the source and drain regions. Such contacts disadvantageously exhibit contact resistance due to the significant Schottky barrier across the well-defined boundaries.

SUMMARY OF THE INVENTION

A semiconductor device includes source and drain contact regions which include a non-compounded combination of a semiconductor material and at least one metal. The metal may include an elemental metal, such as gold or aluminum, or may include an intermetallic. The contact regions may be formed by depositing a limited amount of the at least one metal on a source and a drain of the device, and annealing the device to induce diffusion of the at least one metal into the source and drain. The annealing time and temperature may be selected to limit diffusion of the at least one metal.

According to an aspect of the invention, a semiconductor device includes an active semiconductor region having a source and a drain, with a body therebetween, the source and the drain having opposite conductivity from the body; and a gate on the active region, operatively coupled with the source, the drain and the body. The source and the drain include respective source and drain surface contact regions, the contact regions each including a non-compounded combination of a semiconductor material and at least one metal.

According to another aspect of the invention, a method of making a semiconductor device includes the steps of: forming a source and a drain region on an active semiconductor region; and forming source and drain contact regions in the source and drain, respectively, the contact regions each including a non-compounded combination of a semiconductor material and at least one metal.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A semiconductor device includes source and drain contact regions with non-compounded combinations of semiconductor material and at least one metal. The contact regions may be formed by depositing a controlled amount of the at least one metal on the source and the drain, followed by annealing the device at a temperature below the eutectic temperature corresponding to the combination of the semiconductor material and the at least one metal. Process steps subsequent to the formation of the source and drain contact regions may be in temperature and/or duration so as to avoid undesired spreading of the at least one metal in the semiconductor material. For example, the subsequent steps may be low-temperature processing steps performed substantially below the eutectic temperature corresponding to the combination of the semiconductor material and the at least one metal.

Figure 1:
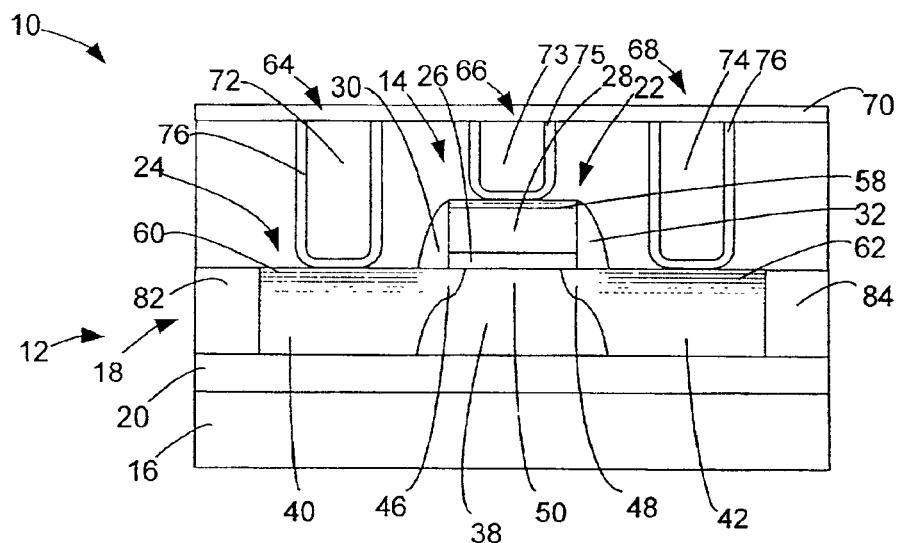
FIG. 1 is a side cross-sectional schematic view of a semiconductor device formed in accordance with the present invention.
Figure 2:
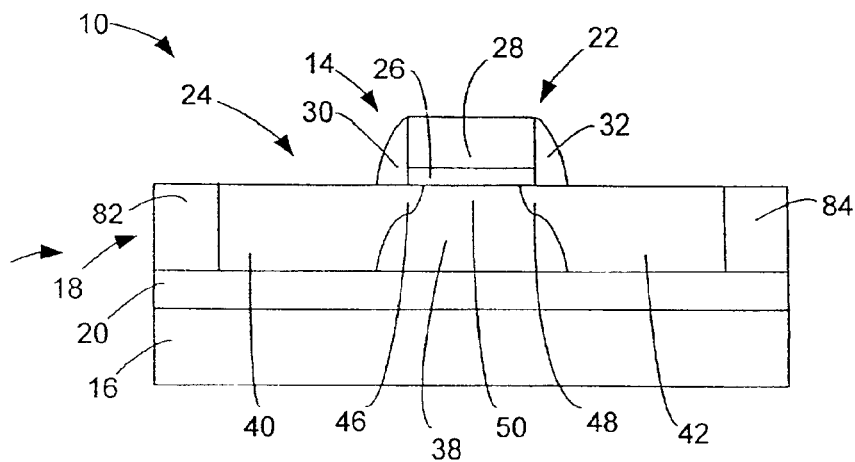
FIGS. 2–5 are side cross-sectional schematic views illustrating various steps in the manufacture of the device of FIG. 1.

Referring initially to FIG. 1, a semiconductor device 10 includes a wafer 12 with a transistor 14 formed thereupon. The wafer 12 may be an SOI wafer (as is shown in FIG. 1), or may alternatively be a bulk semiconductor wafer. The wafer 12 includes a semiconductor substrate 16 and a surface semiconductor layer 18, with a insulator layer 20 therebetween. As is conventional, the semiconductor substrate 16 and the surface semiconductor layer 18 may be made of silicon and the insulator layer 20 may include a silicon oxide such as $SiO_2$, although it will be appreciated that other suitable materials may be used instead or in addition. For example, the semiconductor substrate 16 and/or the surface semiconductor layer 18 may include an alternative semiconductor material such as gallium arsenide.

The transistor 14 includes a gate 22 formed on an active semiconductor region 24 of the surface semiconductor layer 18. The gate 22 includes a gate dielectric 26 and a gate electrode 28. Exemplary materials for the gate dielectric 26 are $SiO_2$ and $Si_3N_4$. The gate electrode 28 may be made of polysilicon or another semiconductor. Alternatively, the gate electrode 28 may be made in whole or in part of metal, with suitable modifications to the device 10 and the below-described fabrication processes.

Spacers 30 and 32 are on respective opposite sides of the gate 22. An exemplary material for the spacers 30 and 32 is SiN.

The active region 24 includes a body 38, with a source 40 and a drain 42 on respective opposite sides of the body. The source 40 and the drain 42 have respective source and drain extensions 46 and 48. The body includes a channel 50 between the source 40 and the drain 42 along the underside of the gate dielectric 26. As is conventional, the body 38 is of different conductivity semiconductor material than the source 40 and the drain 42. For instance, the body 38 may be P-conductivity silicon while the source 40 and the drain 42 may be N-conductivity silicon. Alternatively, the body 38 may be N-conductivity silicon while the source 40 and the drain 42 may be P-conductivity silicon. Typical dopant materials for achieving N-type conductivity include P, As, and Sb. Typical dopant materials for achieving P-type conductivity include Al, Ga, B, $BF_2$, and In. The dopants may be placed in the active layer 24 when the layer or semiconductor material is formed. Alternatively or in addition, the dopants for one or more of the regions may be added in a later processing step, such as in one or more implanting operations.

The source 40, the drain 42, and the channel 50, are operatively coupled with the gate 22 to function as a transistor. The gate electrode 28, the source 40, and the drain 42, have respective contact regions, a gate contact region 58, a source contact region 60, and a drain contact region 62. The contact regions 58–62 provide a means for electrically connecting the gate electrode 28, the source 40, and the drain 42, to respective metal contacts 64, 66, and 68. As explained in greater detail below, the contact regions 58–62 include a non-compounded combination of a semiconductor material and at least one metal.

The metal contacts 64–68 electrically couple the gate electrode 28, the source 40, and the drain 42, to an array of electrical conductors 70, which are coupled to electrical devices such as potential sources, for providing current, and/or voltage to the gate electrode 28, the source 40, and the drain 42. The metal contacts 64–68 include respective plugs 72–74, with respective barrier caps 76–78 between the plugs and the contact regions 58–62. The plugs 72–74 may include tungsten. The barrier caps 76–78 may include a barrier metal such as titanium, and another layer such as a layer of titanium nitride. The barrier metal may have a thickness of about 600 Angstroms, and the additional layer may have a thickness of about 150 Angstroms. The barrier caps 76–78 prevent the materials of the plugs from contaminating the gate electrode 28, the source 40, and the drain 42. An insulator material 80 is between adjacent pairs of the metal contacts 64–68, forming a base for supporting the electrical conductors 70.

The electrical conductors 70 may be common metallic conductors, such as aluminum or copper. As is conventional, the conductors 70 are multiple layers, with electrical insulator layers between layers of conductive material in the array of electrical conductors 70. The insulator material of the insulator layers may include a semiconductor oxide, a semiconductor nitride, and/or a semiconductor oxy-nitride.

The active region 24 is laterally isolated from other structures of the device 10 by insulator-filled trenches 82 and 84 on opposite sides of the active region. The insulator-filled trenches 82 and 84 may be trenches filled with silicon dioxide ($SiO_2$), produced using known shallow trench isolation (STI) techniques. It will be appreciated that other suitable isolation structures/techniques may be used alternatively or in addition.

As stated above, the contact regions 58–62 include a non-compounded combination of semiconductor material and at least one metal (referred to for brevity as "non-compounded combinations"). "Non-compounded combination," as used herein, excludes stoichiometric combinations of materials, such as semiconductor-metal compounds like silicides. An analogy may drawn to the distinction in metal-metal combinations between conventional metal alloys, a disordered combination of two metals (analogous to the non-compounded combinations in the contact regions 58–62), and stoichiometric intermetallic compounds of metals (analogous to conventional semiconductor-metal compounds such as silicides).

The term "non-compounded combinations" is further limited to essentially electrically conducting combinations, as opposed to essentially semiconductive combinations such as doped semiconductor materials.

The at least one metal in the non-compounded combination may be an elemental metal. Exemplary elemental metals include gold, aluminum, arsenic, antimony, bismuth, and indium, although it will be appreciated that suitable other metals be used. The elemental metal may be a metal which is incapable of forming stoichiometric combinations with the semiconductor material. Alternatively, the elemental metal may be capable of forming of a stoichiometric compound with the semiconductor material, but may introduced into the semiconductor material in a manner such that the stoichiometric compound either is not formed, or is formed in insubstantial amounts. For example, the elemental metal may be introduced into the semiconductor material at a temperature sufficiently below the eutectic temperature of the combination, such that formation of the stoichiometric metal-semiconductor compound is inhibited.

Further, additional processing of the semiconductor device 10 may be conducted under such conditions so as to inhibit formation of stoichiometric metal-semiconductor compounds and/or to avoid undesirable overspreading of the non-compounded combination. For example, such additional processing may be low-temperature processing performed sufficiently below the eutectic temperature of the combination of the semiconductor material and the elemental metal. It will be appreciated that the conditions for inhibiting formation of stoichiometric compounds and for avoiding overspreading non-compounded combinations will depend at least on the semiconductor material and metal involved.

Alternatively, the at least one metal may itself be an intermetallic. The intermetallic may be an intermetallic that is substantially incapable of forming stoichiometric compounds with the semiconductor material. Alternatively, the intermetallic may be introduced into the semiconductor material in such as a way and under such conditions that formation of stoichiometric metal-semiconductor compounds is inhibited. An example of a suitable intermetallic is aluminum/gold. Suitable precautions, such as those discussed above with regard to elemental metals, may be made to inhibit formation of stoichiometric semiconductor-metal compounds and/or to prevent overspreading of the non-compounded combinations.

The contact regions 58–62 may have a depth of 200 Angstroms or less, and may have a depth of 100 Angstroms or less. It will be appreciated that the contact regions 58–62 do not have sharply defined boundaries with the gate electrode 28, the source 40, and the drain 42. Thus the concentration of non-compounded combination continuously vary from a peak value, for example at the surfaces of the contact regions 58–62, to at or near zero in the adjoining semiconductor material regions. The lack of a sharply-defined boundary between the contact regions 58–62 and the adjoining semiconductor material may result in a lower contact resistance for the contact regions 58–62, when compared with metal-semiconductor compound contact regions such as silicide regions. This may be due to the lack of or reduction of an energy barrier between the contact regions 58–62 and the adjoining semiconductor material. In conventional devices, such an energy barrier occurs at the boundary of the metal-semiconductor compound regions, and results in contact resistance, which leads to inefficient device performance. The contact regions 58–62 may reduce or avoid this contact resistance problem by reducing or eliminating the energy barrier, and may combine high conductivity with low contact resistance.

FIGS. 2–5 illustrate some of the steps in the manufacture of the semiconductor device 10. Starting with a readily-available SOI wafer 12, basic structures for the transistor 14 are produced using well-known methods described below, resulting in the device 10 shown in FIG. 2.

The insulator-filled trenches may be formed using conventional well-known shallow trench isolation (STI) techniques. An exemplary process for forming the insulating trenches 82 and 84 includes forming a thin layer of oxide, approximately 150–200 Angstroms thick, on the surface of the SOI wafer 12, and forming a silicon nitride mask thereon. The mask covers and protects the substrate in the area where the active region 24 are to be formed while leaving exposed the area where the insulator-filled trenches 82 and 84 are to be formed.

Thereafter, the unmasked portions of the semiconductor surface layer 18 (e.g. the portions where the silicon nitride mask has been etched away) are etched away to form an open trench extending at least past the upper surface of the insulator layer 20. The etching process for a silicon substrate is typically an anisotropic etch using hydrogen bromide (HBr) which has selectivity characteristics such that it etches the silicon substrate but not the silicon nitride mask.

The open trench is filled by depositing silicon dioxide ($SiO_2$), formed by a chemical reaction involving $SiH_4$ or TEOS, to form the insulating trenches 82 and 84. After filling the open trench the surface of the wafer is polished using a chemical mechanical polish to remove any excess silicon dioxide layer and the remaining silicon nitride mask.

It will be appreciated that the trenching may be performed at another suitable point in the process, either earlier or later, if desired.

Thereafter the gate 22 is formed on the active region 24. The gate 22, may be formed using well-known processes. For example, a layer of dielectric material may be deposited on a surface of the SOI wafer 12, with a layer of semiconductor material then deposited thereupon. The layers may selectively be etched to form the gate dielectric 26 and the gate electrode 28. The gate electrode 28 may be made out of polysilicon which may be deposited using well-known processes such as low pressure chemical vapor deposition (LPCVD).

Portions of the silicon on opposing sides of the active region 24 that are not masked by the gate 22 then may be doped to produce the source 40 and the drain 42. Such doping may be formed in a two-step doping process, with a low-energy doping to create the extensions 46 and 48, followed by formation of the spacers 30 and 32, and then a high-energy doping to create the remainder of the source 40 and the drain 42. Because the ions cannot penetrate the gate 22, the gate effectively operates as a doping mask, protecting the region of the semiconductor layer 18 underneath the gate from doping.

To form the spacers 30 and 32, a conformal dielectric layer (e.g., SiN) may be deposited on the SOI wafer 12 and on the gate 22. Parts of the dielectric layer are then selectively removed to leave respective gate source-side and drain-side spacers 30 and 32. The deposit of the dielectric material and its selective removal may be accomplished by conventional means, for example chemical vapor deposition (CVD) such as LPCVD or plasma enhanced chemical vapor deposition (PECVD), of silicon dioxide, followed by anisotropic etching using suitable, well-known etchants, an exemplary etchant being $CHF_3$.

Alternatively, tilted implants may be used to form the source extension 46 and the drain extension 48.

Figure 3:
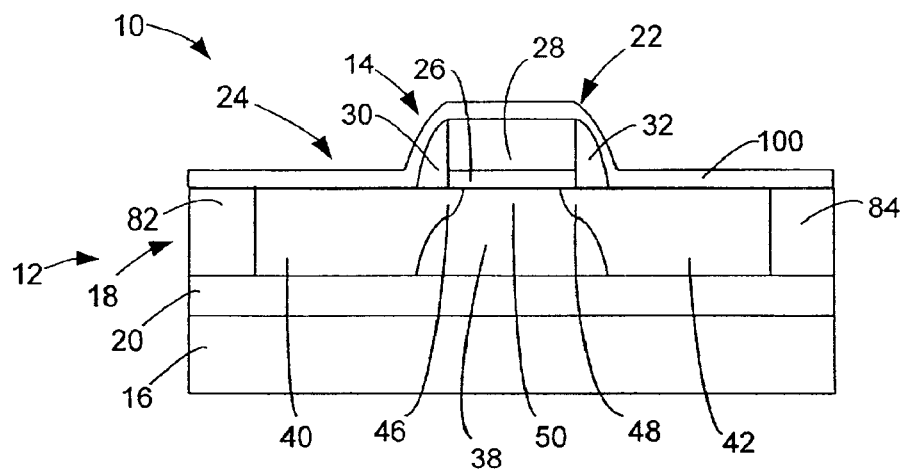

Turning now to FIG. 3, a metal layer 100 is deposited on the device 10. The metal layer 100 contains the at least one metal subsequently to be combined with the semiconductor material of the active layer 24, to form the contact regions 58–62. The metal layer 100 may be deposited by conventional means, such as by CVD. The thickness of the metal layer 100 may be carefully controlled in order to limit the amount of the at least one metal to be introduced into the gate electrode 28, the source 40, and the drain 42. For example, the thickness of the metal layer 100 may be from about 50 angstroms to about 200 angstroms.

It will be appreciated that the at least one metal may be deposited on the gate electrode 28, the source 40, and/or the drain 42 by other suitable means and in other suitable configurations.

Figure 4:
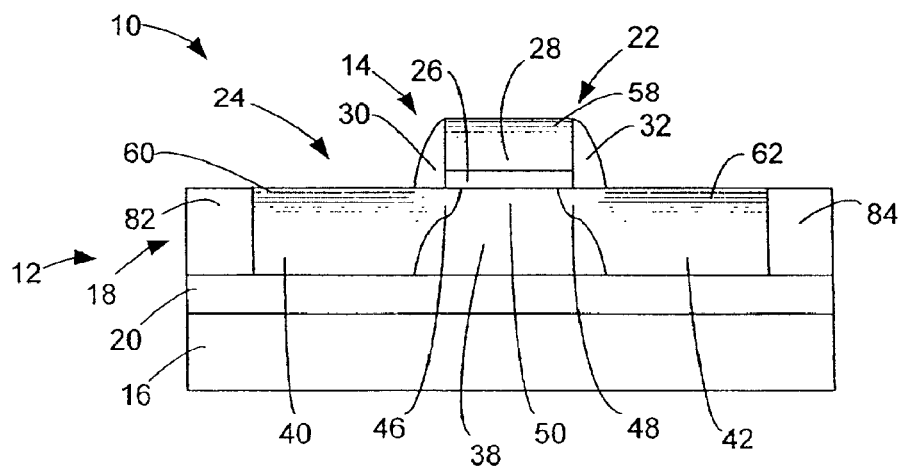

As shown in FIG. 4, the semiconductor device 10 is then heated, causing the metal of the metal layer 100 to migrate into the gate electrode 28, the source 40, and the drain 42. As discussed above, the annealing temperature and/or the annealing time may be selected to avoid stoichiometric compounding between the metal and the semiconductor material, and/or to avoid overspreading of the metal within the gate electrode 28, the source 40, and/or the drain 42. For gold with silicon, an exemplary heating temperature is about 395° C. (degrees C.) and an exemplary heating time is on the order of seconds. For aluminum and silicon, an exemplary heating temperature is from about 450 to 500° C. and an exemplary heating time is on the order of minutes. However, it will be appreciated that the actual temperatures and times used may be highly dependent on such variables as the materials involved (the metal and the semiconductor material), the dimensions of the various regions of the transistor 14, and the desired properties of the semiconductor device 10.

The annealing may cause substantially all of the metal of the metal layer 100 to migrate into the gate electrode 28, the source 40, and the drain 42. Alternatively, there may be unmigrated metal of the metal layer 100 remaining after the annealing. Such unmigrated metal may be removed following the annealing by suitable well-known means.

Figure 5:
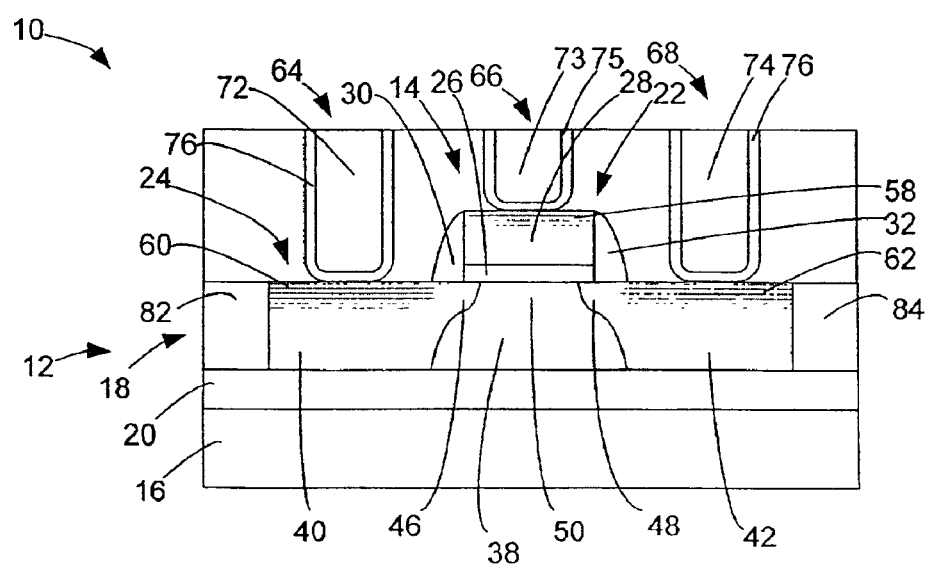

Referring now to FIG. 5, the insulator material 80 and the metal contacts 64–68 are formed. The insulator material 80 may be deposited and planarized by well-known suitable methods. The insulator material 80 is then etched to make openings for the metal contacts 64–68. The barrier caps 76–78 of the metal contacts may be formed by depositing 600 angstroms of titanium, followed by a deposition of 150 angstroms of titanium nitride. The depositions may be accomplished by suitable well-known methods, such as CVD. A rapid thermal anneal (RTA) may then be conducted, followed by deposition and polishing of a conductive metal such as tungsten, thereby forming the plugs 72–74.

The electrical conductors 70 may then be formed, resulting in the semiconductor device 10 shown in FIG. 1.

It will be appreciated that the process shown in FIGS. 2–5 is but one example of a suitable process for forming the device 10 of FIG. 1, and that a wide variety of suitable variants may be possible. For example, steps may be combined or performed in a different order, if suitable.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making a semiconductor device, comprising:

forming a source and a drain in an active semiconductor region; and forming source and drain contact regions in the source and drain, respectively, the contact regions each including a non-compounded combination of a semiconductor material and an intermetallic;

wherein the forming the contact regions includes dispersing the intermetallic within the semiconductor material without compounding the intermetallic with the semiconductor material;

wherein the forming the contact regions includes:
depositing a metal layer that includes the intermetallic, on the source and the drain, and
annealing the device to allow ingress of the intermetallic to form the contact regions, without compounding the intermetallic with the semiconductor material; and wherein the intermetallic includes both gold and aluminum.

2. The method of claim 1, wherein further processing steps after the forming the source and drain contact regions are performed at a temperature below the eutectic temperature of the non-compounded combination.

3. The method of claim 1, wherein the annealing occurs at a temperature no greater then about 500° C.

4. The method of claim 1,
wherein the depositing includes depositing the metal layer also on a gate atop the active semiconductor region; and
wherein the annealing also includes allowing ingress of the intermetallic of the metal layer into the gate to form a gate contact region, without compounding the intermetallic with gate semiconductor material.

5. A method of making a semiconductor device, comprising:

depositing a metal layer on at least one of a source and a drain of an active semiconductor region; and annealing the device to allow ingress of metal of the metal layer into the at least one of the source and the drain to form at least one contact region in the at least one of the source and the drain;

wherein the metal layer is an intermetallic layer; and wherein the intermetallic layer includes both gold and aluminum.

6. The method of claim 5,
wherein the depositing includes depositing the metal layer also on a gate atop the active semiconductor region; and
wherein the annealing also includes allowing ingress of the intermetallic of the metal layer into the gate to form a gate contact region, without compounding the intermetallic with gate semiconductor material.

7. The method of claim 5, wherein further processing steps after the depositing and the annealing are performed at a temperature below the eutectic temperature of the contact region.

8. The method of claim 5, wherein the annealing occurs at a temperature no greater than about 500° C.

9. The method of claim 5, wherein the at least one contact region formed by the annealing is a non-compounded combination of semiconductor material of the active semiconductor region, and intermetallic material of the intermetallic layer.

* * * * *